United States Patent
Hirata et al.

(10) Patent No.: US 12,152,913 B2
(45) Date of Patent: *Nov. 26, 2024

(54) FRONT-END CIRCUIT AND ENCODER

(71) Applicant: Mitutoyo Corporation, Kanagawa (JP)

(72) Inventors: Shu Hirata, Kanagawa (JP); Tomohiro Tahara, Tokyo (JP); Akio Kawai, Kanagawa (JP); Shun Mugikura, Kanagawa (JP)

(73) Assignee: MITUTOYO CORPORATION, Kawasaki (JP)

( * ) Notice: Subject to any disclaimer, the term of this patent is extended or adjusted under 35 U.S.C. 154(b) by 238 days.

This patent is subject to a terminal disclaimer.

(21) Appl. No.: 17/698,406

(22) Filed: Mar. 18, 2022

(65) Prior Publication Data
US 2022/0307866 A1    Sep. 29, 2022

(30) Foreign Application Priority Data
Mar. 24, 2021    (JP) .................................. 2021-050176

(51) Int. Cl.
*G01D 5/20* (2006.01)
*H03F 3/45* (2006.01)
(Continued)

(52) U.S. Cl.
CPC ........... *G01D 5/20* (2013.01); *H03F 3/45475* (2013.01); *H03K 17/51* (2013.01); *H04B 1/04* (2013.01); *H04B 2001/045* (2013.01)

(58) Field of Classification Search
CPC ...... G01D 5/20; H03F 3/45475; H03K 17/51; H04B 1/04; H04B 2001/045; G01R 31/00; G01R 33/00
See application file for complete search history.

(56) References Cited

U.S. PATENT DOCUMENTS

| 4,994,804 A | 2/1991 | Sakaguchi |
| 8,026,760 B1* | 9/2011 | Prasad ................ H03F 3/45475 |
| | | 330/311 |

(Continued)

FOREIGN PATENT DOCUMENTS

| JP | H1-233921 A | 9/1989 |
| JP | 2002-261614 | 9/2002 |

(Continued)

OTHER PUBLICATIONS

Japanese Office Action Corresponding to JP Application No. 2021-050176, issued Aug. 6, 2024, 11 pages.

*Primary Examiner* — Jermele M Hollington
*Assistant Examiner* — Taqi R Nasir
(74) *Attorney, Agent, or Firm* — Rankin, Hill & Clark LLP

(57) ABSTRACT

A preamplifier amplifies signals input to first and second input terminals. A first switching circuit receives first and second input signals and respectively outputs those signals to the first and second input terminals. A switched capacitor circuit samples two signals amplified by the preamplifier. An integration circuit includes a fully differential operational amplifier outputting amplifying differential signals input between third and fourth input terminals between second and first output terminals, and first and second integration capacitors. A second switching circuit switches a connection relationship between the switched capacitor circuit, and the first and second integration capacitors. A third switching circuit switches a connection relationship between the first and second integration capacitors, and third and fourth output terminals. A cycle including sampling and signal integration is performed twice, and the first to third switching circuits switch the connection relationships each time the cycle changes.

6 Claims, 9 Drawing Sheets

(51) Int. Cl.
*H03K 17/51* (2006.01)
*H04B 1/04* (2006.01)

(56) References Cited

U.S. PATENT DOCUMENTS

| | | |
|---|---|---|
| 2002/0149508 A1 | 10/2002 | Hamashita |
| 2004/0141558 A1 | 7/2004 | Plisch et al. |
| 2011/0241780 A1* | 10/2011 | Honda ................ H03F 3/45183 |
| | | 330/253 |
| 2011/0298644 A1* | 12/2011 | Ohba ...................... H03F 3/005 |
| | | 341/155 |
| 2013/0182595 A1 | 7/2013 | Shimizu et al. |
| 2017/0250661 A1* | 8/2017 | Imaizumi ............ H03F 3/45475 |

FOREIGN PATENT DOCUMENTS

| | | |
|---|---|---|
| JP | 2005-062123 | 3/2005 |
| JP | 2005-077137 | 3/2005 |
| JP | 2006-516377 A | 6/2006 |
| JP | 2008-079129 | 4/2008 |
| JP | 2008-219404 A | 9/2008 |
| JP | 2009-250918 A | 10/2009 |
| JP | 2011-169811 A | 9/2011 |
| JP | 2012-194193 A | 10/2012 |
| JP | 2013-149021 | 8/2013 |
| JP | 2014-44194 A | 3/2014 |
| JP | 2016-042627 | 3/2016 |
| JP | 2016-161441 | 9/2016 |
| JP | 2018-198407 A | 12/2018 |
| WO | 2004/066540 A2 | 8/2004 |
| WO | 2010-103580 | 9/2012 |

* cited by examiner

FRONT-END CIRCUIT AND ENCODER

INCORPORATION BY REFERENCE

This application is based upon and claims the benefit of priority from Japanese patent application No. 2021-50176, filed on Mar. 24, 2021, the disclosure of which is incorporated herein its entirety by reference.

BACKGROUND

The present disclosure relates to a front-end circuit and an encoder.

An encoder is used for position detection in various equipment having a drive part such as a machine tool (Japanese Unexamined Patent Application Publications No. 2005-62123, 2005-77137, and 2016-161441). An encoder is a displacement measuring apparatus attached to a drive shaft or a rotary shaft of a machine tool or a three-dimensional measuring machine, and generally includes a linear encoder for detecting linear displacement and a rotary encoder for detecting a rotation angle. As a detection method of the encoder, optical, magnetic, capacitive, electromagnetic induction, or the like are known.

Generally, an encoder includes a transducer that detects a signal in response to scale displacement, a drive circuit that drives the transducer, a reception circuit that converts an analog signal output from the transducer into a digital signal, and a signal processing unit that performs predetermined signal processing on the digital signal. The reception circuit includes a front-end circuit that amplifies a received signal and an analog-to-digital converter (ADC) that converts the signal amplified by the front-end circuit into the digital signal.

In the encoder, it is rare that continuous signals are used, and the front-end circuit samples an input signal at a predetermined timing to generate the received signal, and thereby discrete position detection is performed (e.g., Japanese Unexamined Patent Application Publications No. 2013-149021 and International Patent Publication No. WO 2010/103580). Such a front-end circuit generally includes a preamplifier, a switched capacitor circuit, and an integration circuit. In an encoder for detecting multi-phase (e.g., three phases or four phases) signals, it is known that a fully differential switched capacitor circuit (International Patent Publication No. WO 2010/103580, Japanese Unexamined Patent Application Publications No. 2002-261614, No. 2008-79129, and No. 2016-42627) is used as the switched capacitor circuit.

SUMMARY

As described above, the front-end circuit includes the amplifier such as a preamplifier and a differential amplifier included in an integration circuit. Therefore, when the front-end circuit amplifies the input signal, input offset voltages of the preamplifier and the differential amplifier are also amplified, and these amplified voltages are included as output offset voltages in an output signal of the front-end circuit.

The output offset voltages cause a decrease in position detection accuracy.

Further, although an influence of the output offset voltages can be reduced by limiting gains of the amplifiers and an amplitude of the input signal, a dynamic range of a system such as an encoder in which the front-end circuit is mounted is narrowed, which is not preferable.

The present disclosure has been made in view of the above circumstances and aims to provide a front-end circuit capable of reducing an influence of an offset of an amplifier.

A first aspect of the present disclosure is a front-end circuit including: a preamplifier configured to amplify signals input to first and second input terminals; a first switching circuit configured to receive first and second input signals and to alternatively and respectively output the first and second input signals to the first and second input terminals; a switched capacitor circuit configured to sample two signals amplified by the preamplifier; an integration circuit including a fully differential operational amplifier outputting signals obtained by amplifying differential signals input between third and fourth input terminals as differential signals between second and first output terminals, and first and second integration capacitors; a second switching circuit configured to be capable of switching a connection relationship between the switched capacitor circuit, and one end of the first integration capacitor and one end of the second integration capacitor; and a third switching circuit configured to be capable of switching a connection relationship between the other end of the first integration capacitor and the other end of the second integration capacitor, and third and fourth output terminals, in which double correlation sampling in which a cycle including sampling by the switched capacitor circuit and signal integration by the integration circuit is performed twice is performed, and each time the cycle changes, the first switching circuit respectively switches output destinations of the first and second input signals between the first and second input terminals, the second switching circuit respectively switches output destinations of the two signals sampled by the switched capacitor circuit between the first and second integration capacitors, and the third switching circuit respectively switches connection destinations of the first and second integration capacitors between the third and fourth output terminals. Thus, an influence of an input offset voltage of the preamplifier and an influence of an input offset voltage of the fully differential operational amplifier can be canceled.

A second aspect of the present disclosure is the above front-end circuit, in which, in a first cycle being one of the two cycles, the first switching circuit respectively outputs the first and second input signals to the first and second input terminals of the preamplifier, the second switching circuit respectively outputs the two signals obtained by sampling the signals obtained by amplifying the first and second input signals by the preamplifier to the first and second integration capacitors, and the third switching circuit respectively connects the first and second integration capacitors to the third and fourth output terminals, and, in a second cycle being the other of the two cycles, the first switching circuit respectively outputs the first and second input signals to the second and first input terminals of the preamplifier, the second switching circuit respectively outputs the two signals obtained by sampling the signals obtained by amplifying the second and first input signals by the preamplifier to the first and second integration capacitors, and the third switching circuit respectively connects the first and second integration capacitors to the fourth and third output terminals. Thus, the influence of an input offset voltage of the preamplifier and the influence of an input offset voltage of the fully differential operational amplifier can be canceled.

A third aspect of the present disclosure is the above front-end circuit, in which the first switching circuit includes: a first switch, the first input signal being input to one end thereof and the other end thereof being connected to the first input terminal; a second switch, the first input signal being input to one end thereof and the other end thereof being connected to the second input terminal; a third switch, the second input signal being input to one end thereof and the other end thereof being connected to the second input terminal; and a fourth switch, the second input signal being input to one end thereof and the other end thereof being connected to the first input terminal, the switched capacitor circuit includes: a fifth output terminal outputting one of the two signals sampled by the switched capacitor circuit; and a sixth output terminal outputting the other of the two signals sampled by the switched capacitor circuit, the second switching circuit includes: a fifth switch connected between the fifth output terminal and the first integration capacitor; a sixth switch connected between the sixth output terminal and the first integration capacitor; a seventh switch connected between the sixth output terminal and the second integration capacitor; and an eighth switch connected between the fifth output terminal and the second integration capacitor, the second switching circuit includes: a ninth switch inserted between the first integration capacitor and the third output terminal; a tenth switch inserted between the first integration capacitor and the fourth output terminal; an eleventh switch inserted between the second integration capacitor and the fourth output terminal; and a twelfth switch inserted between the second integration capacitor and the third output terminal, and the first, third, fifth, seventh, ninth, and eleventh switches, and the second, fourth, sixth, eighth, tenth and twelfth switches are complementary turned on and turned off as the cycle changes. Thus, by switching the switches, the influence of an input offset voltage of the preamplifier and an influence of the input offset voltage of the fully differential operational amplifier can be canceled.

A fourth aspect of the present disclosure is the above front-end circuit, in which, in the first cycles, the first, third, fifth, seventh, ninth, and eleventh switches are turned on and the second, fourth, sixth, eighth, tenth, and twelfth switches are turned off, and, in the other of the two cycles, the first, third, fifth, seventh, ninth, and eleventh switches are turned off, and the second, fourth, sixth, eighth, tenth, and twelfth switches are turned on. Thus, in double correlation sampling, by switching the switches, the influence of an input offset voltage of the preamplifier and an influence of the input offset voltage of the fully differential operational amplifier can be canceled.

A fifth aspect of the present disclosure is the above front-end circuit, in which the preamplifier outputs the signals obtained by amplifying the signals input to the first and second input terminals from the seventh and eighth output terminals, respectively, the signal obtained by sampling the signal output from the seventh output terminal is output from the fifth output terminal, and the signal obtained by sampling the signal output from the eighth output terminal is output from the sixth output terminal. Thus, the influence of an input offset voltage of the preamplifier can be canceled.

A sixth aspect of the present disclosure is an encoder including: a scale in which a scale in which a scale track is disposed; a detection head configured to output signals of two or more phases indicating a detection result of the scale; and a signal processing apparatus including a front-end circuit configured to receive signals corresponding to two phases in the signals of two or more phases, in which the front-end circuit includes: a preamplifier configured to amplify signals input to first and second input terminals; a first switching circuit configured to receive first and second input signals and to alternatively and respectively output the first and second input signals to the first and second input terminals; a switched capacitor circuit configured to sample two signals amplified by the preamplifier; an integration circuit including a fully differential operational amplifier outputting signals obtained by amplifying differential signals input between third and fourth input terminals as differential signals between second and first output terminals, and first and second integration capacitors; a second switching circuit configured to be capable of switching a connection relationship between the switched capacitor circuit, and one end of the first integration capacitor and one end of the second integration capacitor; and a third switching circuit configured to be capable of switching a connection relationship between the other end of the first integration capacitor and the other end of the second integration capacitor, and third and fourth output terminals, in which double correlation sampling in which a cycle including sampling by the switched capacitor circuit and signal integration by the integration circuit is performed twice is performed, and each time the cycle changes, the first switching circuit respectively switches output destinations of the first and second input signals between the first and second input terminals, the second switching circuit respectively switches output destinations of the two signals sampled by the switched capacitor circuit between the first and second integration capacitors, and the third switching circuit respectively switches connection destinations of the first and second integration capacitors between the third and fourth output terminals. Thus, the influence of an input offset voltage of the preamplifier and the influence of an input offset voltage of the fully differential operational amplifier can be canceled.

According to the present disclosure, it is possible to provide a front-end circuit capable of reducing an influence of an offset of an amplifier.

The above and other objects, features, and advancements of the present disclosure will become more fully understood from the detailed description given hereinbelow and the accompanying drawings which are given by way of illustration only, and those are not to be considered as limiting the present disclosure.

DESCRIPTION OF EMBODIMENTS

Figure 1:
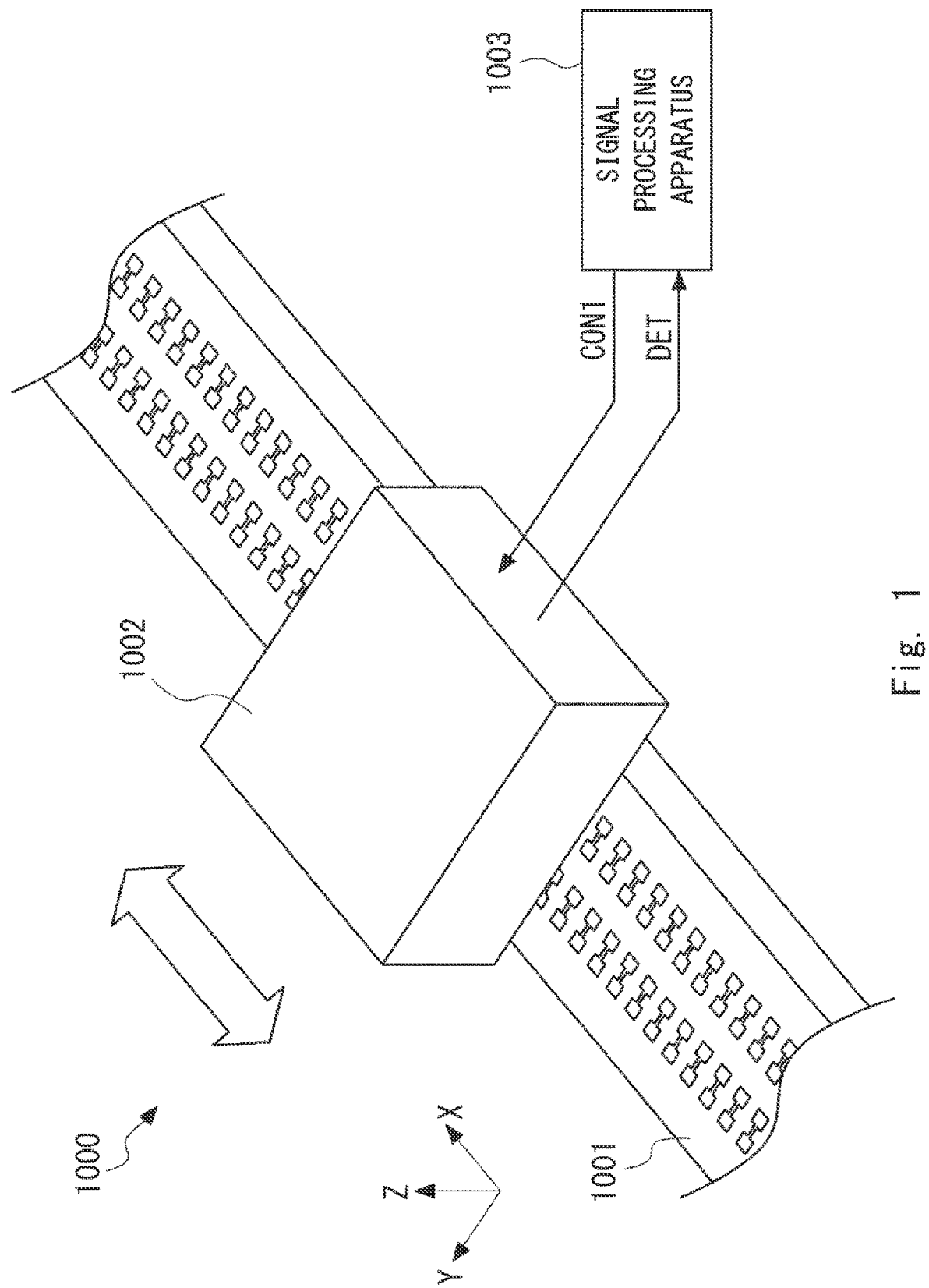
FIG. 1 schematically shows a configuration of an encoder according to a first exemplary embodiment.

Hereinafter, exemplary embodiments of the present disclosure will be described with reference to the drawings. In the drawings, the same elements are denoted by the same reference signs, and repeated descriptions will be omitted as necessary.

First Exemplary Embodiment

As a premise for understanding an encoder according to a first exemplary embodiment, an electromagnetic induction type absolute encoder as an example of a general encoder will be described. FIG. 1 schematically shows a configuration of an encoder 1000 configured as an electromagnetic induction type absolute encoder. The encoder 1000 includes a scale 1001, a detection head 1002, and a signal processing apparatus 1003. The scale 1001 and the detection head 1002 are configured to be relatively movable in a direction in which displacement is measured. Hereinafter, the measurement direction will be described as an X-direction. Principal surfaces of the scale 1001 and the detection head 1002 are an X-Y plane that is parallel to the X-direction and a Y-direction perpendicular to the X-direction. The scale 1001 and the detection head 1002 are arranged apart in a Z-direction perpendicular to the X-direction and the Y-direction. an operation of each part of the detection head 1002 is controlled in response to, for example, a control signal CON1 output from the signal processing apparatus 1003. A detection signal DET indicating a detection result of the detection head 1002 is output to the signal processing apparatus 1003.

The encoder 1000 is configured to use, for example, a four-phase signal. Hereinafter, the scale 1001 and the detection head 1002 when the four-phase signal is used will be described. It should be appreciated that the scale 1001 and the detection head 1002 correspond to the scale 1001 and the detection head 1002, respectively.

Figure 2:
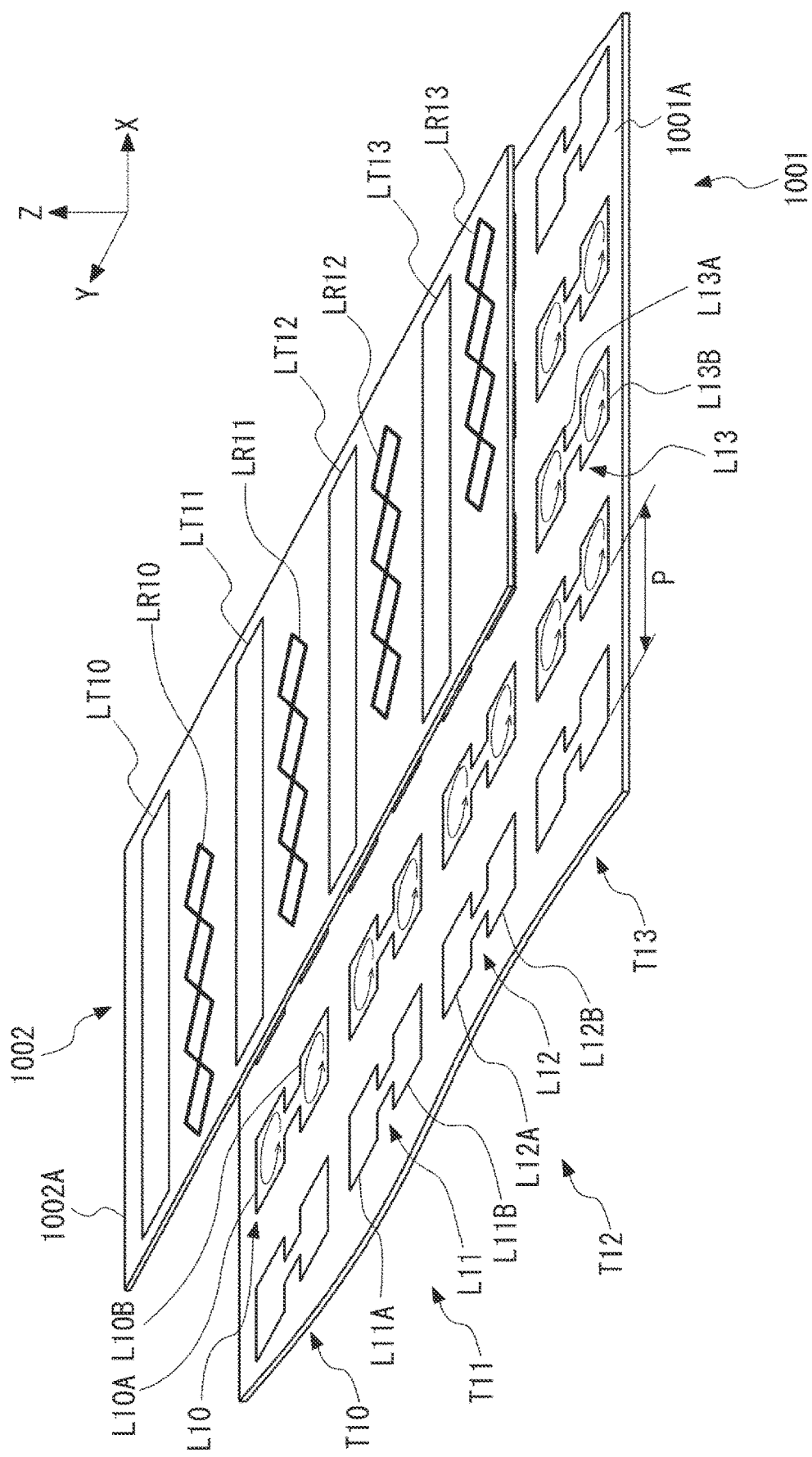
FIG. 2 is a perspective view of a scale and a detection head when a four-phase signal is used.
Figure 3:
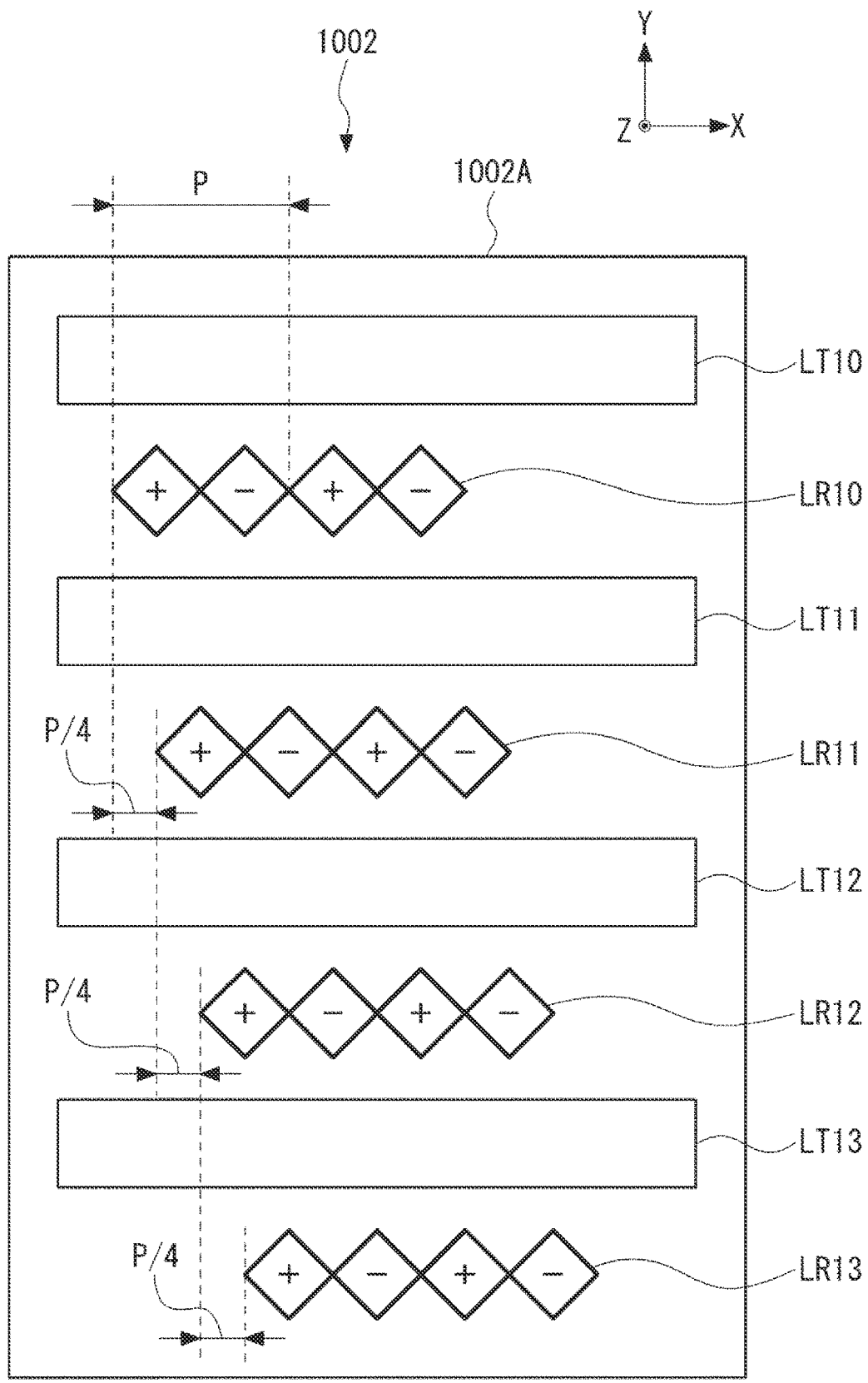
FIG. 3 is a top view of the scale when the four-phase signal is used.

FIG. 2 is a perspective view of the scale 1001 and the detection head 1002 when the four-phase signal is used. FIG. 3 is a top view of the detection head 1002 when the four-phase signal is used. The scale 1001 includes a plate-like member 1001A whose principal surface is the X-Y plane and whose longitudinal direction is the X-direction. On the plate-like member 1001A, scale tracks T10 to T13 extending in the X-direction are arranged in the Y-direction. In each of the scale tracks T10 to T13, the scale windings L10 to L13 are arranged at a period P in the X-direction. The scale tracks T10 to T13 are arranged in such a manner that the scale windings L10 to L13 are arranged in the Y-direction, i.e., arranged for achieving phase synchronization.

The detection head 1002 has a plate-like member 1002 A whose principal surface is the X-Y plane. In FIGS. 2 and 3, only transmission windings LT10 to LT13 and reception windings LR10 to LR13 respectively corresponding to the scale tracks T10 to T13 of the scale 1001 are represented for simplification of the drawings.

The transmission windings LT10 to LT13 are arranged to overlap the windings L10A to L13A of the scale windings L10 to L13 in the Z-direction, respectively.

The reception windings LR10 to LR13 are arranged to overlap the windings L10B to L13B of the scale windings L10 to L13 in the Z-direction, respectively. The reception winding LR11 is disposed at a position shifted in the X-direction by ¼ of the period P, that is, by P/4, with respect to the reception winding LR10. The reception winding LR12 is disposed at a position shifted in the X-direction by ¼ of the period P, that is, by P/4, with respect to the reception winding LR11, and, i.e., by ½ of the period P, that is, by P/2, with respect to the reception winding LR10. The reception winding LR13 is disposed at a position shifted in the X-direction by ¼ of the period P, that is, by P/4, with respect to the reception winding LR12, i.e., by ½ of the period P, that is, by P/2, with respect to the reception winding LR11, and, i.e., by ¾ of the period P, that is, by 3P/4 with respect to the reception winding LR10.

Next, position detection in the scale track T10 will be described. An AC signal is provided to the transmission winding LT10 from, for example, an excitation circuit (not shown), and an induced magnetic field is generated. An induced current is generated in the winding L10A of the scale winding L10 by the induced magnetic field generated in the transmission winding LT10. As a result, an induced current flows also in the winding L10B that forms a pair with the winding L10A. An induced magnetic field is generated by the induced current flowing in the winding L10B, and an induced current is generated in the reception winding LR10 by the induced magnetic field. The induced current flowing in the reception winding LR10 is sent to the signal processing apparatus 1003 as a detection signal of the scale winding L10 (e.g., included in the detection signal DET in FIG. 1).

Position detection in the scale track T11 will be described. The scale track T11 has the same structure as the scale track T10 and performs the same operation. The transmission winding LT11, the winding L11A, the winding L11B, and the reception winding LR11 correspond to the transmission winding LT10, the winding L10A, the winding L10B, and the reception winding LR10, respectively, and a description of details thereof will be omitted. As described above, the reception winding LR11 is disposed at a position shifted in the X-direction by ¼ of the period P, that is, by P/4, with respect to the reception winding LR10. Therefore, a detection signal of the scale winding L11 is a signal whose phase is shifted by 90° with respect to the detection signal of the scale winding L10.

Position detection in the scale track T12 will be described. The scale track T12 has the same structure as the scale track T10 and performs the same operation. The transmission winding LT12, the winding L12A, the winding L12B, and the reception winding LR12 correspond to the transmission winding LT10, the winding L10A, the winding L10B, and the reception winding LR10, respectively, and a description of details thereof will be omitted. As described above, the reception winding LR12 is disposed at a position shifted in the X-direction by ¼ of the period P, that is, by P/4, with respect to the reception winding LR11, and, i.e., by ½ of the period P, that is, by P/2, with respect to the reception winding LR10. Therefore, a detection signal of the scale winding L12 is a signal whose phase is shifted by 90° with respect to the detection signal of the scale winding L11 and shifted by 180° with respect to the detection signal of the scale winding L10.

Position detection in the scale track T13 will be described. The scale track T13 has the same structure as the scale track T10 and performs the same operation. The transmission winding LT13, the winding L13A, the winding L13B, and the reception winding LR13 correspond to the transmission winding LT10, the winding L10A, the winding L10B, and the reception winding LR10, respectively, and a description of details thereof will be omitted. As described above, the reception winding LR13 is disposed at a position shifted in the X-direction by ¼ of the period P, that is, by P/4, with respect to the reception winding LR12, i.e., by ½ of the period P, that is, by P/2, with respect to the reception winding LR11, and, i.e., by ¾ of the period P, that is, by 3P/4, with respect to the reception winding LR10. Therefore, a detection signal of the scale winding L13 is a signal whose phase is shifted by 90° with respect to the detection signal of the scale winding L12, shifted by 180° with respect to the detection signal of the scale winding L11, and shifted by 270° with respect to the detection signal of the scale winding L10.

According to the configuration described above, as the scale 1001 and the detection head 1002 relatively move in the X-direction, signals R0 to R3 (also respectively referred to as signals of first to fourth phases) corresponding to 0°, 180°, 90°, and 270° are output from the reception windings LR10, LR12, LR11, and LR13, respectively.

Figure 4:
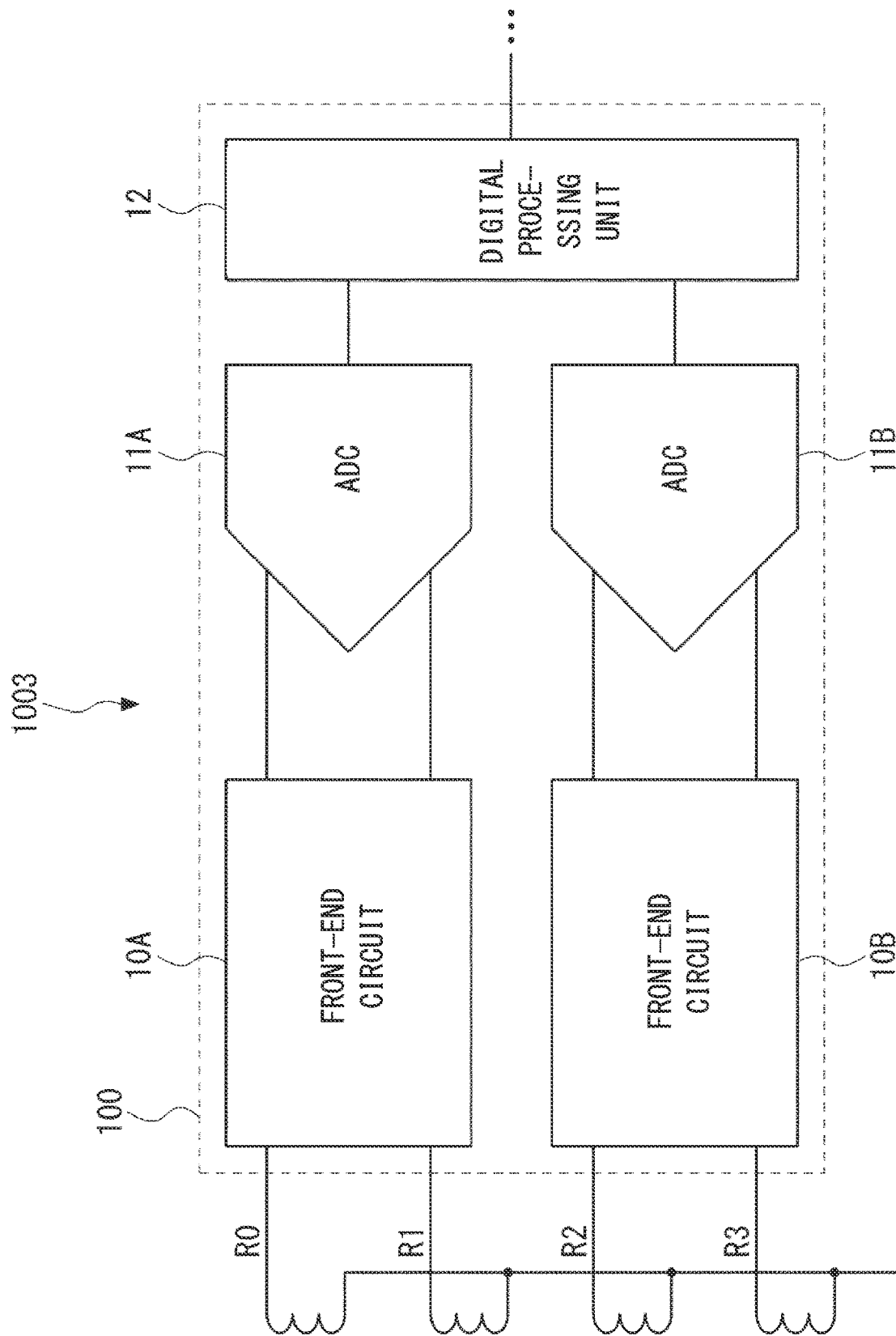
FIG. 4 schematically shows a configuration of a signal processing apparatus according to the first exemplary embodiment.

Next, the signal processing apparatus 1003 will be described. FIG. 4 schematically shows a configuration of the signal processing apparatus 1003. The signal processing apparatus 1003 includes, at least, two front-end circuits 10, two analog-to-digital (A/D) converters 11, and a digital processing unit 12. For convenience, one of the two front-end circuits is denoted by a reference sign 10A and the other is denoted by a reference sign 10B, and one of the two A/D converters is denoted by a reference sign 11A and the other is denoted by a reference sign 11B.

The front-end circuit 10A differentially amplifies the signal R0 corresponding to the phase 0° and the signal R1 corresponding to the phase 180°, and outputs the amplified signals to the A/D converter 11A. The A/D converter 11A outputs a digital signal corresponding to a difference between the two received signals to the digital processing unit 12.

The front-end circuit 10B differentially amplifies the signal R2 corresponding to the phase 90° and the signal R3 corresponding to the phase 270°, and outputs the amplified signals to the A/D converter 11B. The A/D converter 11B outputs a digital signal corresponding to a difference between the two received signals to the digital processing unit 12.

The digital processing unit 12 performs predetermined signal processing on the received two digital signals for performing position detection in the encoder 1000, and outputs a signal obtained by the signal processing.

Figure 5:
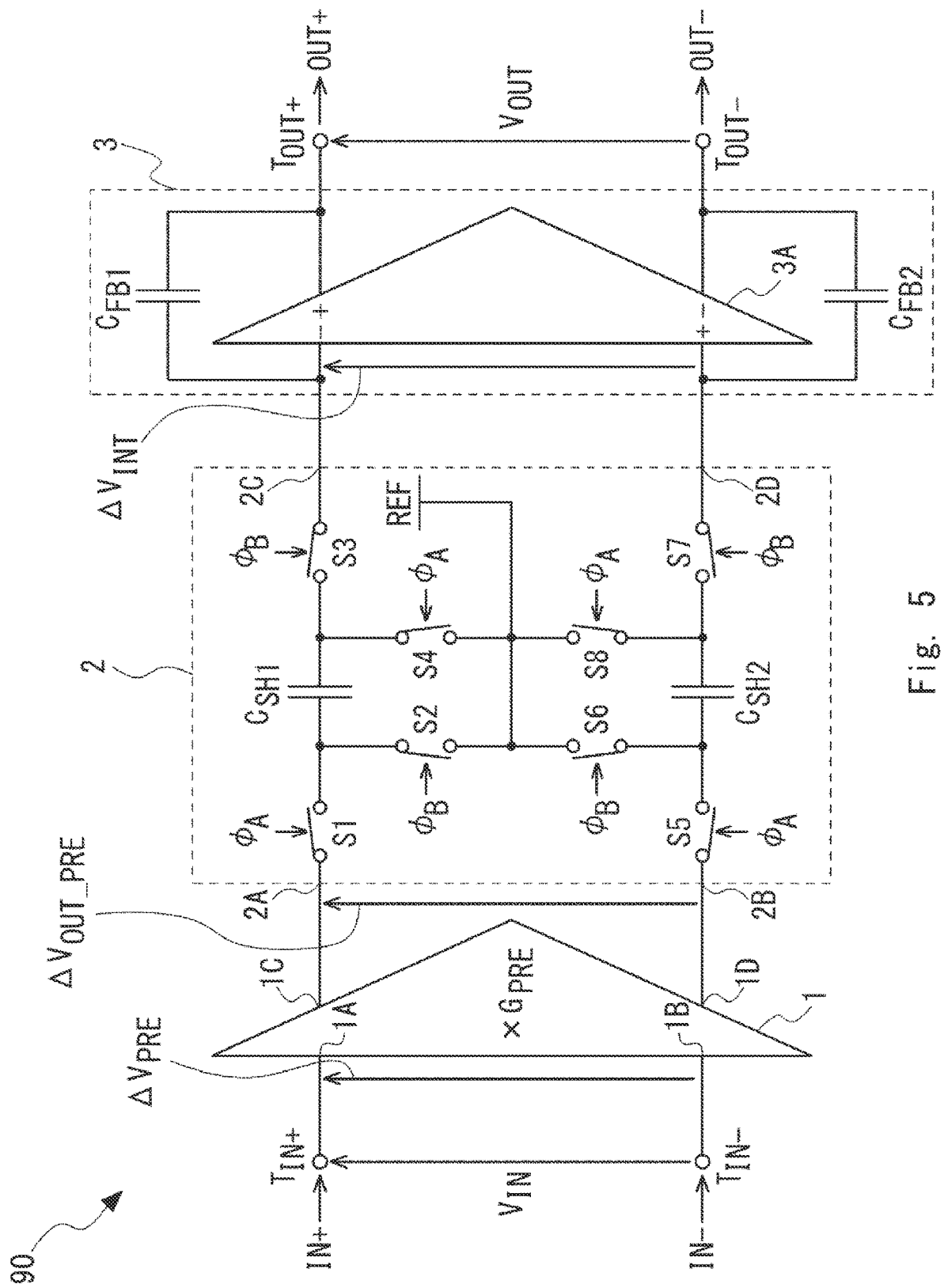
FIG. 5 schematically shows a configuration of a general front-end circuit.

Next, as a premise for understanding a technical significance of the front-end circuit according to the present exemplary embodiment, a configuration of a general front-end circuit and its problems will be described. FIG. 5 schematically shows a configuration of a general front-end circuit 90. The front-end circuit 90 includes a fully differential switched capacitor circuit. Here, the front-end circuit 90 configured as a fully differential switched capacitor type integrator having a sample hold function will be described.

The front-end circuit 90 includes a preamplifier 1, a switched capacitor circuit 2, and an integration circuit 3.

The preamplifier 1 amplifies an input signal IN+ (i.e., Signal R0 or Signal R2) and an input signal IN− (i.e., Signal R1 or Signal R3), and outputs the amplified signals to the switched capacitor circuit 2. Hereinafter, in FIG. 5, a terminal 1A (Upper input terminal) of the preamplifier 1 to which the input signal IN+ is input is referred to as a first input terminal, and a terminal 1B (Lower input terminal) of the preamplifier 1 to which the input signal IN− is input is referred to as a second input terminal. A signal obtained by amplifying the signal input to the input terminal 1A is output from one output terminal 1C (also referred to as a seventh output terminal) of the preamplifier 1, and a signal obtained by amplifying the signal input to the input terminal 1B is output from the other output terminal 1D (also referred to as an eighth output terminal) of the preamplifier 1.

In the switched capacitor circuit 2, the signal output from the output terminal 1C of the preamplifier 1 is input to an input terminal 2A, and the signal output from the output terminal 1D is input to an input terminal 2B. The switched capacitor circuit 2 samples the two input signals (Charges of the two signals) and outputs the sampled signals (Charges) to the integration circuit 3. The charge obtained by sampling the signal input to the input terminal 2A is output from an output terminal 2C (also referred to as a fifth output terminal), and the charge obtained by sampling the signal input to the input terminal 2B is output from an output terminal 2D (also referred to as a sixth output terminal). A configuration of the switched capacitor circuit 2 will be described later.

The integration circuit 3 includes a fully differential operational amplifier 3A and integration capacitors $C_{FB1}$ and $C_{FB2}$. The integration capacitor $C_{FB1}$ is inserted between the inverting input terminal (also referred to as a third input terminal) and the non-inverting output terminal (also referred to as a first output terminal) of the fully differential operational amplifier 3A. The integration capacitor $C_{FB2}$ is inserted between the non-inverting input terminal (also referred to as a fourth input terminal) and the inverting output terminal (also referred to as a second output terminal) of the fully differential operational amplifier 3A. The non-inverting output terminal of the fully differential operational amplifier 3A is connected to an output terminal $T_{OUT+}$ (also referred to as a third output terminal), and an output signal OUT+ is output from the output terminal $T_{OUT+}$. The inverting output terminal of the fully differential operational amplifier 3A is connected to an output terminal $T_{OUT-}$ (also referred to as a fourth output terminal), and an output signal OUT− is output from the output terminal $T_{OUT-}$. In other words, the fully differential operational amplifier 3A outputs a signal obtained by amplifying differential signals input to the non-inverting input terminal and the inverting input terminal from the non-inverting output terminal and the inverting output terminal as differential signals.

Next, a configuration and an operation of the switched capacitor circuit 2 will be described. The switched capacitor circuit 2 includes sampling capacitors $C_{SH1}$ and $C_{SH2}$ and switches S1 to S8.

The switch S1 is inserted between the output terminal 1C of the preamplifier 1 and the sampling capacitor $C_{SH1}$. The switch S2 is inserted between a node between the switch S1 and the sampling capacitor $C_{SH1}$, and a reference voltage source. Hereinafter, an output voltage of the reference voltage source is referred to as REF. The reference voltage REF is, for example, a ground voltage. The switch S3 is inserted between the sampling capacitor $C_{SH1}$ and the output terminal 2C of the switched capacitor circuit 2. The switch S4 is inserted between a node between the switch S3 and the sampling capacitor $C_{SH1}$, and the reference voltage source.

The switch S5 is inserted between the output terminal 1D of the preamplifier 1 and the sampling capacitor $C_{SH2}$. The switch S6 is inserted between a node between the switch S5 and the sampling capacitor $C_{SH2}$, and the reference voltage source. The switch S7 is inserted between the sampling capacitor $C_{SH2}$ and the output terminal 2D of the switched capacitor circuit 2. The switch S8 is inserted between a node between the switch S7 and the sampling capacitor $C_{SH2}$, and the reference voltage source.

The switches S1, S4, S5, and S8 (also referred to as a first switch group) are synchronously turned on and turned off in response to a control signal φA, and the switches S2, S3, S6, and S7 (also referred to as a second switch group) are synchronously turned on and turned off in response to a control signal φB. The switches of the first switch group and the switches of the second switch group are controlled to be complementarily turned on. That is, the switches included in the two groups are controlled not to be turned on at the same time.

An operation of the front-end circuit 90 will be described below. When the control signal φA becomes HIGH and the control signal φB becomes LOW, the switches S1, S4, S5, and S8 are turned on and the switches S2, S3, S6, and S7 are turned off. Thus, the sampling capacitors $C_{SH1}$ and $C_{SH2}$ are charged with reference to the reference voltage REF, and the voltage $V_{OUT\_PRE}$ is sampled (Sampling operation).

Next, when the control signal φA becomes LOW and the control signal φB becomes HIGH, the switches S1, S4, S5, and S8 are turned off and the switches S2, S3, S6, and S7 are turned on. Thus, the charge of the sampling capacitor $C_{SH1}$ is transferred to the integration capacitor $C_{FB1}$, and the charge of the sampling capacitor $C_{SH2}$ is transferred to the integration capacitor $C_{FB2}$ (Charge transfer operation).

The transferred charges are accumulated in the integration capacitors $C_{FB1}$ and $C_{FB2}$ of the integration circuit 3, and an output voltage corresponding to the accumulated charges is output. An operation in which the sampling operation and the charge transfer operation are performed one time is referred to as one sampling cycle.

Next, the output voltage of the front-end circuit 90, that is, the output voltage $V_{OUT}$ which is the difference voltage between the output terminal $T_{OUT+}$ and the output terminal $T_{OUT-}$ is considered. Hereinafter, capacitances of the sampling capacitors $C_{SH1}$ and $C_{SH2}$ are defined as $C_{SH}$, capacitances of the integration capacitors $C_{FB1}$ and $C_{FB2}$ are defined as $C_{FB}$, and a gain of the preamplifier 1 is defined as $G_{PRE}$. A difference voltage (Input voltage) between the input signal IN+ and the input signal IN− is defined as $V_{IN}$, a voltage of the input signal IN+ is defined as $+V_{IN}/2$, and a voltage of the input signal IN− is defined as $-V_{IN}/2$. An input offset voltage of the preamplifier 1 is defined as $\Delta V_{PRE}$. An input offset voltage of the fully differential operational amplifier 3A is defined as $\Delta V_{INT}$.

Here, it is assumed that a common voltage of the preamplifier 1 is the same as the reference voltage REF. In this case, charges $Q_{SH1}$ and $Q_{SH2}$ charged to the sampling capacitors $C_{SH1}$ and $C_{SH2}$ in the sampling operation are expressed by the following expressions [1] and [2], respectively. In the following description, calculations are performed under the condition in which the reference voltage REF is zero to facilitate understanding of the sampling operation. An input offset voltage at the input terminal 1A of the preamplifier 1 is defined as $V_{PRE}/2$, and an input offset voltage at the input terminal 1B is defined as $-\Delta V_{PRE}/2$.

$$Q_{SH1} = C_{SH} G_{PRE} \left( \frac{V_{IN}}{2} + \frac{\Delta V_{PRE}}{2} \right) \quad [1]$$

$$Q_{SH2} = C_{SH} G_{PRE} \left( -\frac{V_{IN}}{2} - \frac{\Delta V_{PRE}}{2} \right) \quad [2]$$

The plus sign and the minus sign in the expressions [1] and [2] respectively indicate the plus sign and the minus sign of the charges accumulated at the input side terminals of the sampling capacitors $C_{SH1}$ and $C_{SH2}$, that is, at the terminals connected to the preamplifier 1.

Next, charges $Q'_{SH1}$ and $Q'_{SH2}$ remaining in the sampling capacitors $C_{SH1}$ and $C_{SH2}$ after the charges are transferred in the charge transfer operation are expressed by the following expressions [3] and [4], respectively. Hereinafter, a common voltage of the fully differential operational amplifier 3A is defined as 0, an input offset voltage of the inverting input terminal is defined as $\Delta V_{INT}/2$, and an input offset voltage of the non-inverting input terminal is defined as $-\Delta V_{INT}/2$.

$$Q'_{SH1} = C_{SH} \frac{\Delta V_{INT}}{2} \quad [3]$$

$$Q'_{SH2} = -C_{SH} \frac{\Delta V_{INT}}{2} \quad [4]$$

The plus sign and the minus sign in the expressions [3] and [4] indicate the plus sign and the minus sign of the charges accumulated in the output side terminals of the sampling capacitors $C_{SH1}$ and $C_{SH2}$, that is, at the terminals connected to the fully differential operational amplifier 3A.

In this case, a charge $Q_{FB1}$ transferred to the integration capacitor $C_{FB1}$ is expressed by the difference between the expressions [1] and [3], and a charge $Q_{FB2}$ transferred to the integration capacitor $C_{FB2}$ is expressed by the difference between the expressions [2] and [4].

$$Q_{FB1} = -Q_{SH1} - Q'_{SH1} \quad [5]$$
$$= -C_{SH} G_{PRE} \left( \frac{V_{IN}}{2} + \frac{\Delta V_{PRE}}{2} \right) - C_{SH} \frac{\Delta V_{INT}}{2}$$

$$Q_{FB2} = -Q_{SH2} - Q'_{SH2} \quad [6]$$
$$= C_{SH} G_{PRE} \left( \frac{V_{IN}}{2} + \frac{\Delta V_{PRE}}{2} \right) + C_{SH} \frac{\Delta V_{INT}}{2}$$
$$= -Q_{FB1}$$

The plus sign and the minus sign in the expressions [5] and [6] indicate the plus sign and the minus sign of the charges accumulated at the input side terminals of the integration capacitors $C_{FB1}$ and $C_{FB2}$, that is, at the terminal connected to the input terminals of the fully differential operational amplifier 3A.

Therefore, the output voltage $V_{OUT}$ that is a differential voltage between the output signal OUT+ and the output signal OUT− is expressed by the following expression [7].

$$V_{OUT} = \left( -\frac{Q_{FB1}}{C_{FB}} + \frac{\Delta V_{INT}}{2} \right) - \left( -\frac{Q_{FB1}}{C_{FB}} - \frac{\Delta V_{INT}}{2} \right) \quad [7]$$
$$= -\frac{2Q_{FB1}}{C_{FB}} + \Delta V_{INT}$$
$$= -\frac{2}{C_{FB}} \left[ -C_{SH} \cdot G_{PRE} \left( \frac{V_{IN}}{2} + \frac{\Delta V_{PRE}}{2} \right) - C_{SH} \frac{\Delta V_{INT}}{2} \right] + \Delta V_{INT}$$
$$= G_{PRE} \frac{C_{SH}}{C_{FB}} (V_{IN} + \Delta V_{PRE}) + \frac{C_{SH}}{C_{FB}} \Delta V_{INT} + \Delta V_{INT}$$
$$= G_{PRE} \frac{C_{SH}}{C_{FB}} V_{IN} + G_{PRE} \frac{C_{SH}}{C_{FB}} \Delta V_{PRE} + \left( \frac{C_{SH}}{C_{FB}} + 1 \right) \Delta V_{INT}$$

The coefficients $G_{PRE} \cdot C_{SH}/C_{FB}$ multiplied by the input voltage $V_{IN}$ of the first term of the right side of the expression [7] indicates a signal gain for the input voltage $V_{IN}$ input to the front-end circuit 90.

The second term of the right side indicates that the input offset voltage $\Delta V_{PRE}$ of the preamplifier 1 is amplified by the signal gain.

It is generally understood that the input offset voltage $\Delta V_{PRE}$ of the preamplifier 1 is large, and the input offset voltage $\Delta V_{PRE}$ amplified by the signal gain of the front-end circuit 90 is included in the output voltage $V_{OUT}$.

$C_{SH}/C_{FB}$ in the third term of the right side is a signal gain of the integration circuit 3. Therefore, the third term of the right side indicates that the input offset voltage $\Delta V_{INT}$ of the fully differential operational amplifier 3A is amplified by [the signal gain of the integration circuit+1] times. That is, an influence of the input offset voltage $\Delta V_{INT}$ of the fully differential operational amplifier 3A is also added to the output voltage $V_{OUT}$.

As described above, the influences of the input offset voltages of these amplifiers cause deterioration of the position detection accuracy in the encoder.

On the other hand, the present exemplary embodiment proposes a front-end circuit capable of eliminating the influence of the input offset voltage of the pre-amplifier 1. A front-end circuit 10 according to the first exemplary embodiment will be described below.

Figure 6:
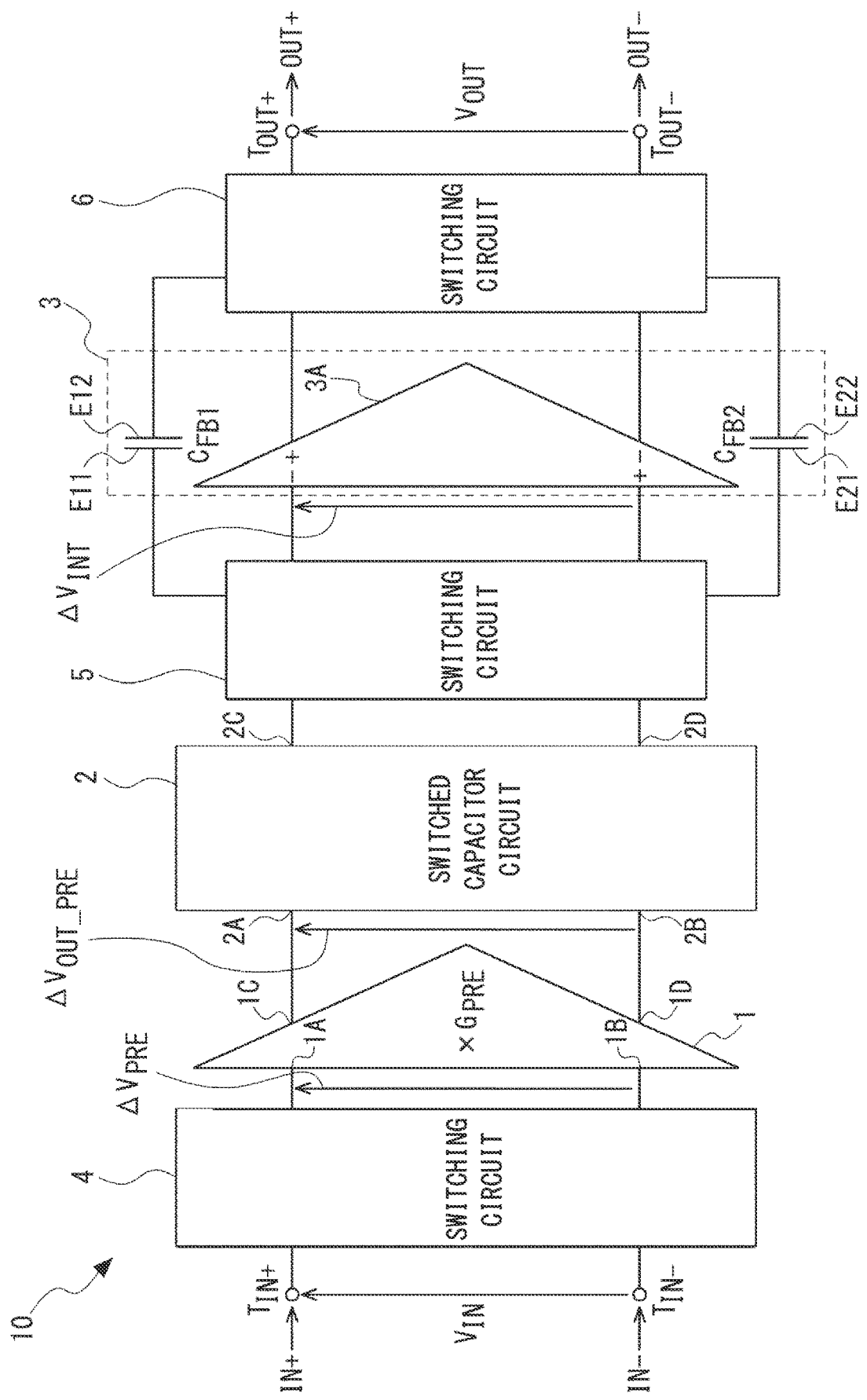
FIG. 6 schematically shows an outline configuration of a front-end circuit according to the first exemplary embodiment.
Figure 7:
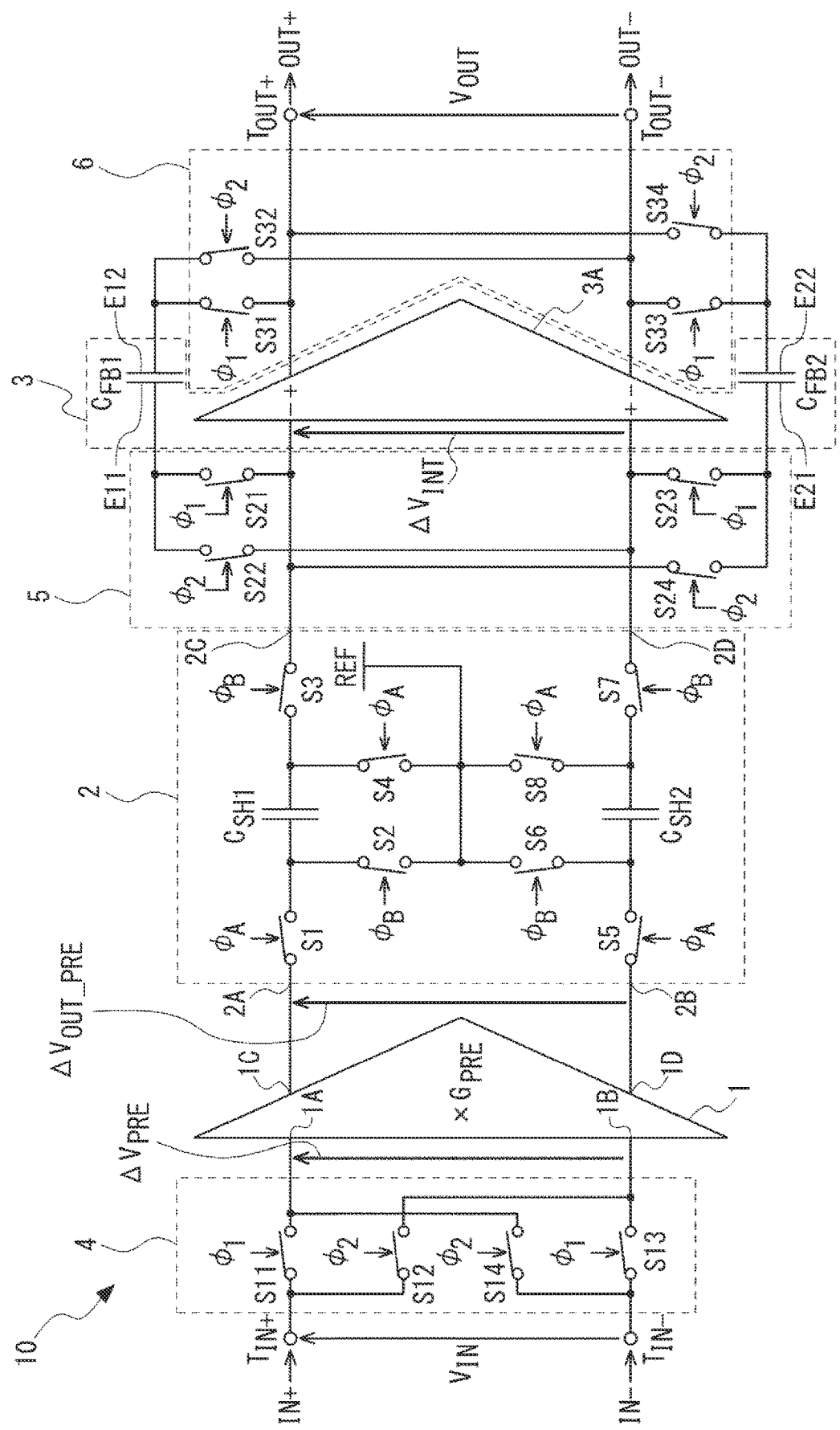
FIG. 7 shows the configuration of the front-end circuit according to the first exemplary embodiment in more detail.

FIG. 6 schematically shows an outline configuration of the front-end circuit 10 according to the first exemplary embodiment. FIG. 7 shows the configuration of the front-end circuit 10 according to the first exemplary embodiment in more detail. The front-end circuit 10 has a configuration in which switching circuits 4 to 6 are added to the front-end circuit 90. The front-end circuit 10 is configured as a circuit for performing so-called correlated double sampling (CDS) by switching the connection by the switching circuits 4 to 6. The preamplifier 1 and the switched capacitor circuit 2 are the same as those of the front-end circuit 90, and thereby the description thereof will be omitted.

The switching circuit 4 (also referred to as a first switching circuit) includes switches S11 to S14 and is inserted between input terminals $T_{IN+}$ and $T_{IN-}$, and the preamplifier 1. The switch S11 is connected between the input terminal $T_{IN+}$ and one input terminal 1A (also referred to as the first input terminal) of the preamplifier 1. The switch S12 is connected between the input terminal $T_{IN+}$ and the other input terminal 1B (also referred to as the second input terminal) of the preamplifier 1. The switch S13 is connected between the input terminal $T_{IN-}$ and the input terminal 1B of the preamplifier 1. The switch S14 is connected between the input terminal $T_{IN-}$ and the input terminal 1A of the preamplifier 1.

The switches S11 and S13 are turned on and turned off in response to the control signal φ1, and the switches S12 and S14 are turned on and turned off in response to the control signal φ2. A pair of the switches S11 and S13 and a pair of the switches S12 and S14 are controlled to be complementarily turned on, that is, not to be turned on at the same time.

The switching circuit 5 (also referred to as a second switching circuit) includes switches S21 to S24 and is inserted between the switched capacitor circuit 2 and the integration circuit 3. The switch S21 is connected between a node between the output terminal 2C of the switched capacitor circuit 2 and the inverting input terminal of the fully differential operational amplifier 3A, and an input side electrode E11 of the integration capacitor $C_{FB1}$. The switch S22 is connected between a node between the output terminal 2D of the switched capacitor circuit 2 and the non-inverting input terminal of the fully differential operational amplifier 3A, and the input side electrode E11 of the integration capacitor $C_{FB1}$. The switch S23 is connected between the node between the output terminal 2D of the switched capacitor circuit 2 and the non-inverting input terminal of the fully differential operational amplifier 3A, and an input side electrode E21 of the integration capacitor $C_{FB2}$. The switch S24 is connected between the node between the output terminal 2C of the switched capacitor circuit 2 and the inverting input terminal of the fully differential operational amplifier 3A, and the input side electrode E21 of the integration capacitor $C_{FB2}$.

The switches S21 and S23 are turned on and turned off in response to the control signal φ1, and the switches S22 and S24 are turned on and turned off in response to the control signal φ2. A pair of the switches S21 and S23 and a pair of the switches S22 and S24 are controlled to be complementarily turned on, that is, not to be turned on at the same time.

The switching circuit 6 (also referred to as a third switching circuit) includes switches S31 to S34 and is inserted between the integration circuit 3, and the output terminals $T_{OUT+}$ and $T_{OUT-}$. The switch S31 is connected between an output side electrode E12 of the integration capacitor $C_{FB1}$, and a node between the non-inverting input terminal of the fully differential operational amplifier 3A and the output terminals $T_{OUT+}$. The switch S32 is connected between the electrode E12 of the integration capacitor $C_{FB1}$, and a node between the inverting input terminal of the fully differential operational amplifier 3A and the output terminals $T_{OUT-}$. The switch S33 is connected between an output side electrode 22 of the integration capacitor $C_{FB2}$, and the node between the inverting input terminal of the fully differential operational amplifier 3A and the output terminals $T_{OUT-}$. The switch S34 is connected between the electrode E22 of the integration capacitor $C_{FB2}$, and the node between the non-inverting input terminal of the fully differential operational amplifier 3A and the output terminals $T_{OUT+}$.

The switches S31 and S33 are turned on and turned off in response to the control signal φ1, and the switches S32 and S34 are turned on and turned off in response to the control signal φ2. A pair of the switches S31 and S33 and a pair of the switches S32 and S34 are controlled to be complementarily turned on, that is, not to be turned on at the same time.

Next, an operation of the front-end circuit 10 will be described. The front-end circuit 10 can cancel the influence of the offset voltage by performing the sampling cycle twice while changing the levels of the control signals φ1 and φ2.

First Sampling Cycle

Figure 8:
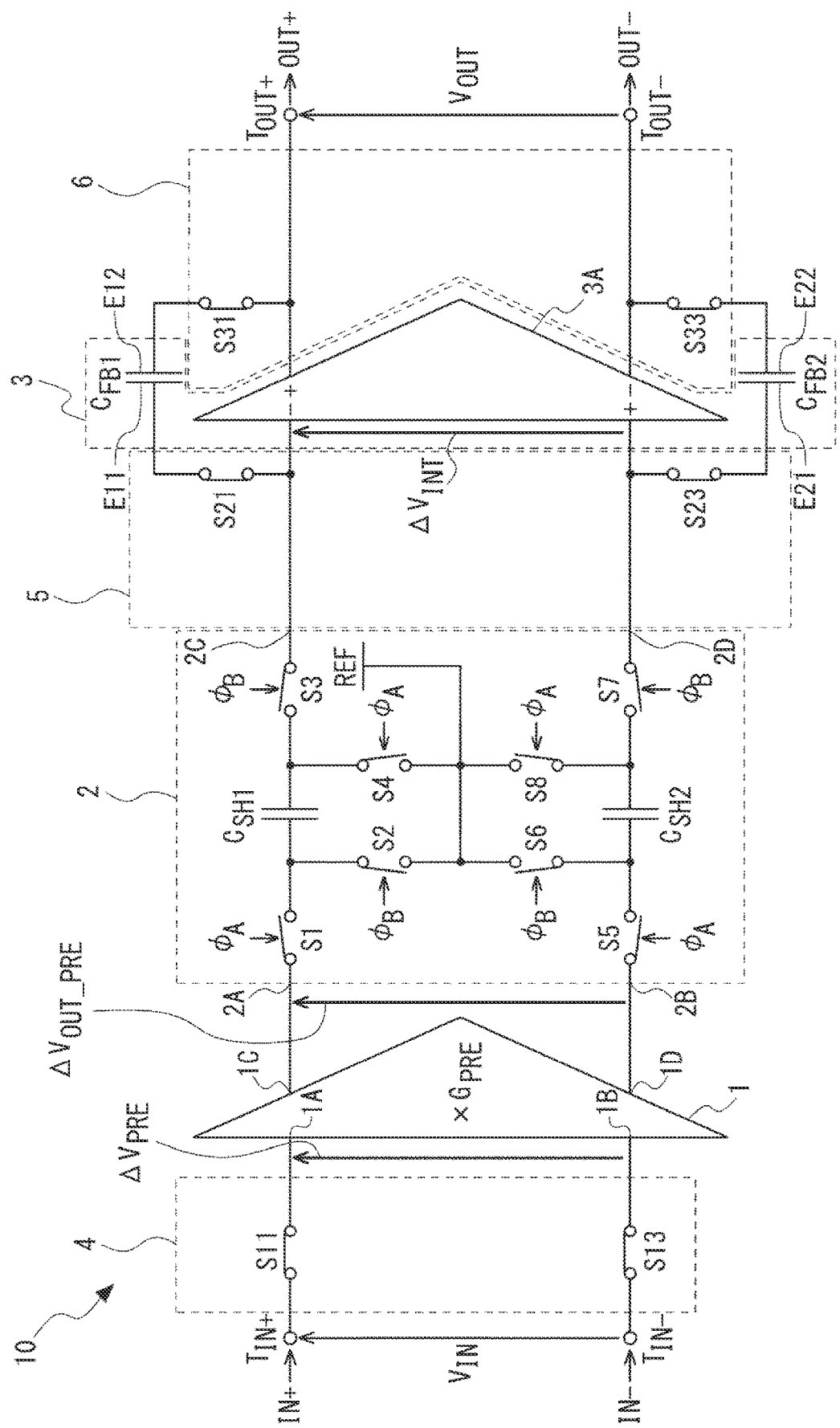
FIG. 8 is an equivalent circuit diagram of the front-end circuit in a first sampling cycle.

FIG. 8 is an equivalent circuit diagram of the front-end circuit 10 in a first sampling cycle. In the first sampling cycle, the control signal φ1 is set to HIGH to turn on the switches S11, S13, S21, S23, S31, and S33, and the control signal φ2 is set to LOW to turn off the switches S12, S14, S22, S24, S32, and S34. In this state, the first sampling cycle is executed. As a result, charges are accumulated in the integration capacitors $C_{FB1}$ and $C_{FB2}$.

Second Sampling Cycle

Figure 9:
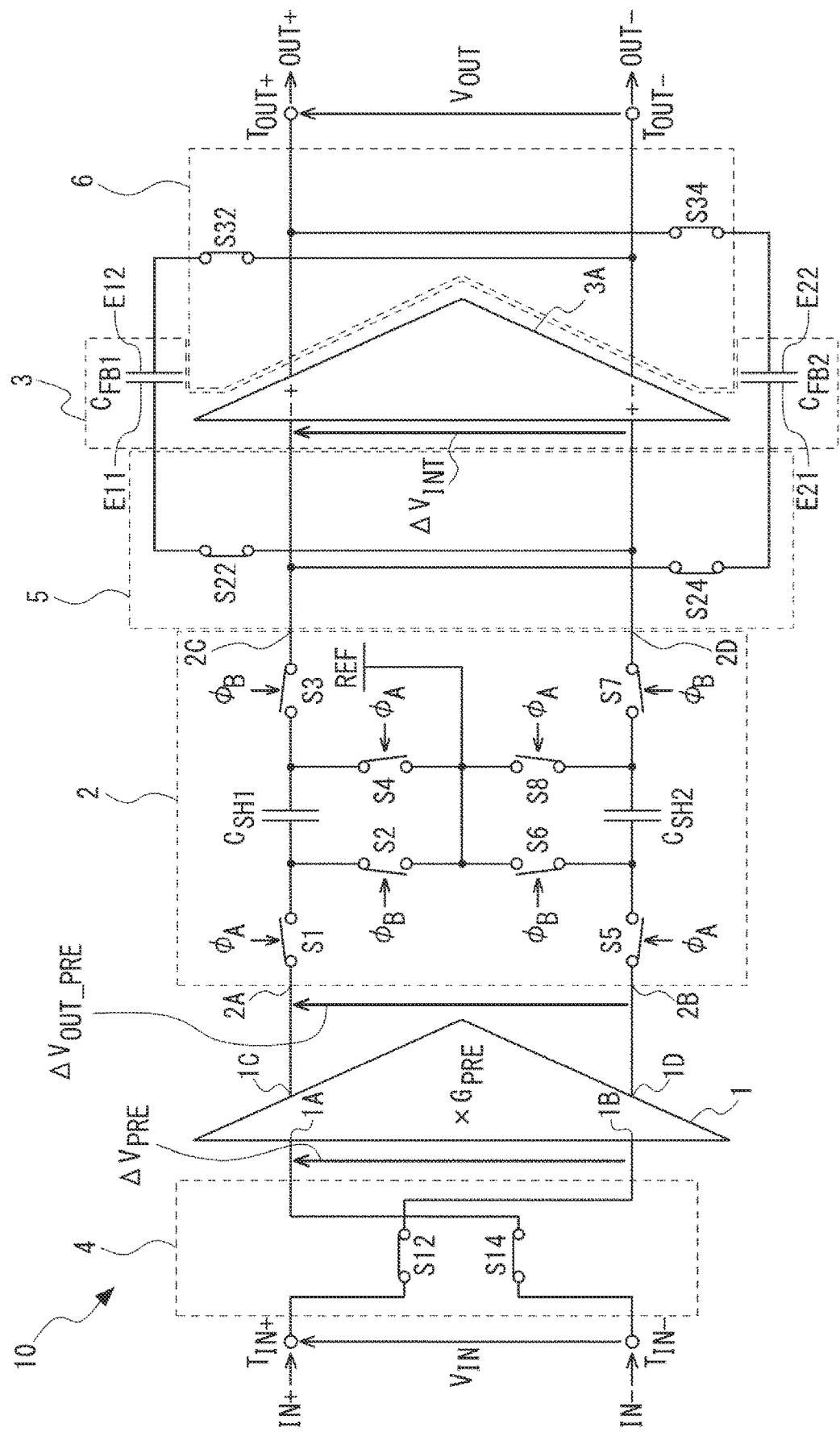
FIG. 9 is an equivalent circuit diagram of the front-end circuit in a second sampling cycle.

FIG. 9 shows an equivalent circuit diagram of the front-end circuit 10 in a second sampling cycle. In the second sampling cycle, the control signal φ1 is set to LOW to turn off the switches S11, S13, S21, S23, S31 and S33, and the control signal φ2 is set to HIGH to turn on the switches S12, S14, S22, S24, S32 and S34. In this state, the second sampling cycle is executed. As a result, charges are accumulated in the integration capacitors $C_{FB1}$ and $C_{FB2}$.

In the above two sampling cycles, the voltage obtained by amplifying the voltage $V_{IN}/2$ of the input signal IN+ by the preamplifier 1 is applied to the integration capacitor $C_{FB1}$, and the voltage obtained by amplifying the voltage $-V_{IN}/2$ of the input signal IN− by the preamplifier 1 is applied to the integration capacitor $C_{FB2}$.

On the other hand, in the first sampling cycle, the voltage obtained by amplifying the input offset voltage $\Delta V_{PRE}$ of the preamplifier 1 by the preamplifier 1 (Output offset voltage of the preamplifier 1) is applied to the integration capacitors $C_{FB1}$ and $C_{FB2}$ in the same manner as the front-end circuit 90. That is, the integration capacitor $C_{FB1}$ is charged with reference to the voltage obtained by amplifying the input offset voltage $\Delta V_{PRE}/2$ by the preamplifier 1, and the integration capacitor $C_{FB2}$ is charged with reference to the voltage obtained by amplifying the input offset voltage $\Delta V_{PRE}/2$ by the preamplifier 1. On the other hand, in the second sampling cycle, the voltage obtained by amplifying the input offset voltage $\Delta V_{PRE}$ of the preamplifier 1 by the preamplifier 1 (Output offset voltage of the preamplifier 1) is inverted with respect to the first sampling cycle and applied to the integration capacitors $C_{FB1}$ and $C_{FB2}$, in other words, applied to the integration capacitors $C_{FB1}$ and $C_{FB2}$ in the opposite polarity with respect to the first sampling cycle. That is, the integration capacitor $C_{FB1}$ is charged with reference to the voltage obtained by amplifying the input offset voltage $-\Delta V_{PRE}/2$ by the preamplifier 1, and the integration capacitor $C_{FB2}$ is charged with reference to the voltage obtained by amplifying the input offset voltage $\Delta V_{PRE}/2$ by the preamplifier 1. Therefore, the influence of the input offset voltage $\Delta V_{PRE}$ of the preamplifier 1 on the output voltage $V_{OUT}$ can be canceled.

Further, in the first sampling cycle, the input offset voltage $\Delta V_{INT}$ of the fully differential operational amplifier 3A is applied to the integration capacitors $C_{FB1}$ and $C_{FB2}$ in the same manner as the front-end circuit 90. That is, the integration capacitor $C_{FB1}$ is charged with reference to the voltage obtained by amplifying the input offset voltage $\Delta V_{INT}/2$ of the fully differential operational amplifier 3A, and the integration capacitor $C_{FB2}$ is charged with reference to the voltage obtained by amplifying the input offset voltage $-\Delta V_{INT}/2$ of the fully differential operational amplifier 3A. On the other hand, in the second sampling cycle, the input offset voltage $\Delta V_{INT}$ of the fully differential operational amplifier 3A is inverted with respect to the first sampling cycle and applied to the integration capacitors $C_{FB1}$ and $C_{FB2}$, in other words, applied to the integration capacitors $C_{FB1}$ and $C_{FB2}$ in the opposite polarity with respect to the first sampling cycle. That is, the integration capacitor $C_{FB1}$ is charged with reference to the voltage obtained by amplifying the input offset voltage $-\Delta V_{INT}/2$ of the fully differential operational amplifier 3A, and the integration capacitor $C_{FB2}$ is charged with reference to the voltage obtained by amplifying the input offset voltage $\Delta V_{INT}/2$ of the fully differential operational amplifier 3A. Therefore, the influence of the input offset voltage $\Delta V_{INT}$ of the fully differential operational amplifier 3A on the output voltage $V_{OUT}$ can be canceled.

Hereinafter, the output voltage $V_{OUT}$ of the front-end circuit 10 will be concretely considered.

Sampling Operation of the First Sampling Cycle

Charges $Q_{SH1\_1}$ and $Q_{SH2\_1}$ charged to the sampling capacitors $C_{SH1}$ and $C_{SH2}$ in the sampling operation of the first sampling cycle are expressed by the following expressions [8] and [9], respectively. As described above, it is assumed that the common voltage of the preamplifier 1 is the same as the reference voltage REF, and the reference voltage REF is zero.

$$Q_{SH1} = C_{SH} G_{PRE}\left(\frac{V_{IN}}{2} + \frac{\Delta V_{PRE}}{2}\right) \quad [8]$$

$$Q_{SH2\_1} = C_{SH} G_{PRE}\left(-\frac{V_{IN}}{2} - \frac{\Delta V_{PRE}}{2}\right) \quad [9]$$

The plus sign and the minus sign in the expressions [8] and [9] indicate the plus sign and the minus sign of the charges accumulated at the input side terminals of the sampling capacitors $C_{SH1}$ and $C_{SH2}$, that is, at the terminals connected to the preamplifier 1.

Charges $Q'_{SH1\_1}$ and $Q'_{SH2\_1}$ remaining in the sampling capacitors $C_{SH1}$ and $C_{SH2}$ after the charges are transferred in the charge transfer operation of the first sampling cycle are expressed by the following expressions [10] and [11], respectively. As described above, the common voltage of the fully differential operational amplifier 3A is zero, the voltage of the inverting input terminal is $\Delta V_{INT}/2$, and the voltage of the non-inverting input terminal is $-\Delta V_{INT}/2$.

$$Q'_{SH1\_1} = C_{SH}\frac{\Delta V_{INT}}{2} \quad [10]$$

$$Q'_{SH2\_2} = -C_{SH}\frac{\Delta V_{INT}}{2} \quad [11]$$

The plus sign and the minus sign in the expressions [10] and [11] indicate the plus sign and the minus sign of the charges accumulated at the output side terminals of the sampling capacitors $C_{SH1}$ and $C_{SH2}$, that is, at the terminals connected to the fully differential operational amplifier 3A.

In this case, a charge $Q_{FB1\_1}$ transferred to the integration capacitor $C_{FB1}$ is expressed by the difference between the expressions [8] and [10], and a charge $Q_{FB2\_1}$ transferred to the integration capacitor $C_{FB2}$ is expressed by the difference between the expressions [9] and [11].

$$Q_{FB1\_1} = -Q_{SH1\_1} - Q'_{SH1\_1} \quad [12]$$
$$= -C_{SH} G_{PRE}\left(\frac{V_{IN}}{2} + \frac{\Delta V_{PRE}}{2}\right) - C_{SH}\frac{\Delta V_{INT}}{2}$$

$$Q_{FB2\_1} = -Q_{SH2\_1} - Q'_{SH2\_1} \quad [13]$$
$$= C_{SH} G_{PRE}\left(\frac{V_{IN}}{2} + \frac{\Delta V_{PRE}}{2}\right) + C_{SH}\frac{\Delta V_{INT}}{2}$$
$$= -Q_{FB1\_1}$$

The plus sign and the minus sign in the expressions [12] and [13] indicate the plus sign and the minus sign the charges accumulated at the input side terminals of the integration capacitors $C_{FB1}$ and $C_{FB2}$, that is, at the terminals connected to the input terminals of the fully differential operational amplifier 3A.

Sampling Operation of the Second Sampling Cycle

Charges $Q_{SH1\_2}$ and $Q_{SH2\_2}$ charged to the sampling capacitors $C_{SH1}$ and $C_{SH2}$ in the sampling operation of the second sampling cycle are expressed by the following expressions [14] and [15], respectively.

$$Q_{SH1\_2} = C_{SH} G_{PRE}\left(-\frac{V_{IN}}{2} + \frac{\Delta V_{PRE}}{2}\right) \quad [14]$$

$$Q_{SH2\_2} = C_{SH} G_{PRE}\left(\frac{V_{IN}}{2} - \frac{\Delta V_{PRE}}{2}\right) \quad [15]$$

The plus sign and the minus sign in the expressions [14] and [15] indicate the plus sign and the minus sign of the charges accumulated at the input side terminals of the sampling capacitors $C_{SH1}$ and $C_{SH2}$, that is, at the terminals connected to the preamplifier 1.

Charges $Q'_{SH1\_2}$ and $Q'_{SH2\_2}$ remaining in the sampling capacitors $C_{SH1}$ and $C_{SH2}$ after the charge is transferred in the charge transfer operation of the second sampling cycle are expressed by the following expressions [16] and [17], respectively.

$$Q'_{SH1\_2} = C_{SH} \frac{\Delta V_{INT}}{2} \qquad [16]$$

$$Q'_{SH2\_2} = -C_{SH} \frac{\Delta V_{INT}}{2} \qquad [17]$$

The plus sign and the minus sign in the expressions [16] and [17] indicate the plus sign and the minus sign of the charges accumulated at the output side terminals of the sampling capacitors $C_{SH1}$ and $C_{SH2}$, that is, at the terminals connected to the fully differential operational amplifier 3A. In the second sampling cycle, the output terminal 2C of the switched capacitor circuit 2 is connected to the integration capacitor $C_{FB2}$ and the inverting input terminal of the fully differential operational amplifier 3A, and the output terminal 2D is connected to the integration capacitor $C_{FB1}$ and the non-inverting input terminal of the fully differential operational amplifier 3A. On the other hand, in the first sampling cycle, the output terminal 2C of the switched capacitor circuit 2 is connected to the integration capacitor $C_{FB1}$ and the inverting input terminal of the fully differential operational amplifier 3A, and the output terminal 2D is connected to the integration capacitor $C_{FB2}$ and the non-inverting input terminal of the fully differential operational amplifier 3A. That is, in the present configuration, each time the cycle changes, the connection relationship between the switched capacitor circuit 2 and the integration capacitors $C_{FB1}$ and $C_{FB2}$ is inverted, and the integration capacitors connected to the output terminals 2C and 2D of the switched capacitor circuit 2 are switched.

In this case, a charge $Q_{FB1\_2}$ transferred to the integration capacitor $C_{FB1}$ is expressed by the difference between the expressions [14] and [16], and a charge $Q_{FB2\_2}$ transferred to the integration capacitor $C_{FB2}$ is expressed by the difference between the expressions [15] and [17].

$$Q_{FB1\_2} = -Q_{SH2\_2} - Q'_{SH2\_2} \qquad [18]$$
$$= -C_{SH} G_{PRE} \left( \frac{V_{IN}}{2} - \frac{\Delta V_{PRE}}{2} \right) + \frac{\Delta V_{INT}}{2}$$

$$Q_{FB2\_2} = -Q_{SH1\_2} - Q'_{SH1\_2} \qquad [19]$$
$$= -C_{SH} G_{PRE} \left( -\frac{V_{IN}}{2} + \frac{\Delta V_{PRE}}{2} \right) - C_{SH} \frac{\Delta V_{INT}}{2}$$
$$= -Q_{FB1\_2}$$

The plus sign and the minus sign in the expressions [18] and [19] indicate the plus sign and the minus sign of the charges accumulated at the input side terminals of the integration capacitors $C_{FB1}$ and $C_{FB2}$, that is, at the terminals connected to the input terminals of the fully differential operational amplifier 3A.

Therefore, the charges $Q_{FB1}$ and $Q_{FB2}$ charged in the integration capacitors $C_{FB1}$ and $C_{FB2}$ in the first sampling cycle and the second sampling cycle are expressed by the following expressions [20] and [21], respectively.

$$Q_{FB1} = Q_{FB1\_1} + Q_{FB1\_2} \qquad [20]$$
$$= -C_{SH} G_{PRE} V_{IN}$$

$$Q_{FB2} = Q_{FB2\_1} + Q_{FB2\_2} \qquad [21]$$
$$= C_{SH} G_{PRE} V_{IN}$$
$$= -Q_{FB1}$$

From the expressions [20] and [21], the output voltage $V_{OUT}$ is expressed by the following expression [22].

$$V_{OUT} = \left( \frac{-Q_{FB2}}{C_{FB}} + \frac{\Delta V_{INT}}{2} \right) - \left( \frac{-Q_{FB1}}{C_{FB}} + \frac{\Delta V_{INT}}{2} \right) \qquad [22]$$
$$= \frac{2Q_{FB1}}{C_{FB}} + \Delta V_{INT}$$
$$= -2G_{PRE} \frac{C_{SH}}{C_{FB}} V_{IN} + \Delta V_{INT}$$

Therefore, according to the present configuration, the influence of the input offset voltage $\Delta V_{PRE}$ of the preamplifier 1 can be eliminated from the output voltage $V_{OUT}$. By comparing the expression [7] with the expression [22], the influence of the relatively large input offset voltage $\Delta V_{PRE}$ of the preamplifier 1 can be eliminated, so that the position detection accuracy of the encoder can be improved as a result.

As can be understood from the expression [22], according to the present configuration, the influence of the input offset voltage $\Delta V_{INT}$ of the fully differential operational amplifier 3A can be reduced as compared with the front-end circuit 90 (Equation [7]). Therefore, in the present configuration, the influences of the input offset voltages of the amplifiers can be advantageously reduced.

Further, in the present configuration, reduction of noise such as 1/f noise can be achieved by performing so-called correlated double sampling (CDS) in which the same signal (Input voltage $V_{IN}$) is sampled in two parts.

Further, since the offset in the output voltage can be suppressed, a dynamic range of the front-end circuit can be increased.

In the front-end circuit 10, integrated sampling may be performed to reduce the noise and increase the gain. The integrated sampling means that a set including the first sampling cycle and the second sampling cycle described above is repeated a plurality of times. At this time, assuming that the gain of the fully differential operational amplifier 3A acting on the output voltage $V_{OUT}$ after the integrated sampling is $G_{INT}$, the output voltage $V_{OUT}$ in this case is expressed by the following expression [23].

$$V_{OUT} = -2G_{INT} G_{PRE} \frac{C_{SH}}{C_{FB}} V_{IN} + \Delta V_{INT} \qquad [23]$$

In the expression [23], since only the input voltage $V_{IN}$ is multiplied by the gain $G_{INT}$ of the fully differential operational amplifier 3A, the offsets of the amplifiers are eliminated. Therefore, the offset component included in the output voltage $V_{OUT}$ obtained by the integrated sampling is eliminated, and, as a result, the position detection accuracy of the encoder can be further improved.

Other Exemplary Embodiments

It should be noted that the present invention is not limited to the embodiment described above, and can be appropriately changed without departing from the spirit thereof. For example, the first sampling cycle and the second sampling cycle may be performed in a different order.

As long as the influence of the offset voltages of the preamplifier 1 and the fully differential operational amplifier 3A can be reduced as in the above embodiment, the connection relationships among the preamplifier 1, the switched capacitor circuit 2, the integration circuit 3, and the switching circuits in the front-end circuit may be appropriately changed.

In the above-described embodiment, an electromagnetic induction type absolute encoder has been described as an example of an encoder. However, it should be appreciated that the above-described front-end circuit may be applied to other detection type encoders such as an optical type, a magnetic type, and a capacitive type. Further, it should be appreciated that the above-described front-end circuit may be applied to either an absolute encoder or an incremental encoder.

From the disclosure these described, it will be obsolete that the embodiments of the disclosure may be varied in many ways. Such variations are not to be registered as a departure from the spirit and scope of the disclosure, and all such modifications as would be obsolete to one skilled in the art are intended for inclusion within the scope of the following claims.

What is claimed is:

1. A front-end circuit comprising:
   a preamplifier configured to amplify signals input to first and second input terminals;
   a first switching circuit configured to receive first and second input signals and to alternatively and respectively output the first and second input signals to the first and second input terminals;
   a switched capacitor circuit configured to sample two signals amplified by the preamplifier;
   an integration circuit comprising a fully differential operational amplifier outputting signals obtained by amplifying differential signals that are input between third and fourth input terminals and are the two signals sampled by the switched capacitor circuit as differential signals between second and first output terminals, and first and second integration capacitors;
   a second switching circuit configured to be capable of switching a connection relationship between the switched capacitor circuit, and one end of the first integration capacitor and one end of the second integration capacitor; and
   a third switching circuit configured to be capable of switching a connection relationship between the other end of the first integration capacitor and the other end of the second integration capacitor, and third and fourth output terminals, wherein
   double correlation sampling in which a cycle including sampling by the switched capacitor circuit and signal integration by the integration circuit is performed twice is performed, and
   each time the cycle changes, the first switching circuit respectively switches output destinations of the first and second input signals between the first and second input terminals, the second switching circuit respectively switches output destinations of the two signals sampled by the switched capacitor circuit between the first and second integration capacitors, and the third switching circuit respectively switches connection destinations of the first and second integration capacitors between the third and fourth output terminals.

2. The front-end circuit according to claim 1, wherein,
   in a first cycle being one of the two cycles, the first switching circuit respectively outputs the first and second input signals to the first and second input terminals of the preamplifier, the second switching circuit respectively outputs the two signals obtained by sampling the signals obtained by amplifying the first and second input signals by the preamplifier to the first and second integration capacitors, and the third switching circuit respectively connects the first and second integration capacitors to the third and fourth output terminals, and,
   in a second cycle being the other of the two cycles, the first switching circuit respectively outputs the first and second input signals to the second and first input terminals of the preamplifier, the second switching circuit respectively outputs the two signals obtained by sampling the signals obtained by amplifying the second and first input signals by the preamplifier to the first and second integration capacitors, and the third switching circuit respectively connects the first and second integration capacitors to the fourth and third output terminals.

3. The front-end circuit according to claim 2, wherein
   the first switching circuit comprises:
      a first switch, the first input signal being input to one end thereof and the other end thereof being connected to the first input terminal;
      a second switch, the first input signal being input to one end thereof and the other end thereof being connected to the second input terminal;
      a third switch, the second input signal being input to one end thereof and the other end thereof being connected to the second input terminal; and
      a fourth switch, the second input signal being input to one end thereof and the other end thereof being connected to the first input terminal,
   the switched capacitor circuit comprises:
      a fifth output terminal outputting one of the two signals sampled by the switched capacitor circuit; and
      a sixth output terminal outputting the other of the two signals sampled by the switched capacitor circuit,
   the second switching circuit comprises:
      a fifth switch connected between the fifth output terminal and the first integration capacitor;
      a sixth switch connected between the sixth output terminal and the first integration capacitor;
      a seventh switch connected between the sixth output terminal and the second integration capacitor; and
      an eighth switch connected between the fifth output terminal and the second integration capacitor,
   the second switching circuit comprises:
      a ninth switch inserted between the first integration capacitor and the third output terminal;
      a tenth switch inserted between the first integration capacitor and the fourth output terminal;
      an eleventh switch inserted between the second integration capacitor and the fourth output terminal; and
      a twelfth switch inserted between the second integration capacitor and the third output terminal, and the first, third, fifth, seventh, ninth, and eleventh switches, and the second, fourth, sixth, eighth, tenth and twelfth, switches are complementary turned on and turned off as the cycle changes.

4. The front-end circuit according to claim 3, wherein, in the first cycles, the first, third, fifth, seventh, ninth, and eleventh switches are turned on and the second, fourth, sixth, eighth, tenth, and twelfth switches are turned off, and, in the other of the two cycles, the first, third, fifth, seventh, ninth, and eleventh switches are turned off, and the second, fourth, sixth, eighth, tenth, and twelfth switches are turned on.

5. The front-end circuit according to claim 3, wherein the preamplifier outputs the signals obtained by amplifying the signals input to the first and second input terminals from the seventh and eighth output terminals, respectively, the switched capacitor circuit outputs the signal obtained by sampling the signal output from the seventh output terminal from the fifth output terminal, and the switched capacitor circuit outputs the signal obtained by sampling the signal output from the eighth output terminal from the sixth output terminal.

6. An encoder comprising:
a scale in which a scale track is disposed;
a detection head configured to output signals of two or more phases indicating a detection result of the scale; and
a signal processing apparatus comprising a front-end circuit configured to receive signals corresponding to two phases in the signals of two or more phases, wherein
the front-end circuit comprises:
   a preamplifier configured to amplify signals input to first and second input terminals;
   a first switching circuit configured to receive first and second input signals and to alternatively and respectively output the first and second input signals to the first and second input terminals;
   a switched capacitor circuit configured to sample two signals amplified by the preamplifier;
   an integration circuit comprising a fully differential operational amplifier outputting signals obtained by amplifying differential signals input between third and fourth input terminals and are the two signals sampled by the switched capacitor circuit as differential signals between second and first output terminals, and first and second integration capacitors;
   a second switching circuit configured to be capable of switching a connection relationship between the switched capacitor circuit, and one end of the first integration capacitor and one end of the second integration capacitor; and
a third switching circuit configured to be capable of switching a connection relationship between the other end of the first integration capacitor and the other end of the second integration capacitor, and third and fourth output terminals, wherein
double correlation sampling in which a cycle including sampling by the switched capacitor circuit and signal integration by the integration circuit is performed twice is performed, and
each time the cycle changes, the first switching circuit respectively switches output destinations of the first and second input signals between the first and second input terminals, the second switching circuit respectively switches output destinations of the two signals sampled by the switched capacitor circuit between the first and second integration capacitors, and the third switching circuit respectively switches connection destinations of the first and second integration capacitors between the third and fourth output terminals.

\* \* \* \* \*